US011017826B2

United States Patent
Kato et al.

(10) Patent No.: US 11,017,826 B2
(45) Date of Patent: *May 25, 2021

(54) MAGNETIC MEMORY DEVICE

(71) Applicant: KABUSHIKI KAISHA TOSHIBA, Tokyo (JP)

(72) Inventors: Yushi Kato, Tokyo (JP); Soichi Oikawa, Tokyo (JP); Hiroaki Yoda, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/697,258

(22) Filed: Nov. 27, 2019

(65) Prior Publication Data

US 2020/0168260 A1    May 28, 2020

(30) Foreign Application Priority Data

Nov. 28, 2018   (JP) .............................. JP2018-222137

(51) Int. Cl.
*G11C 11/16*         (2006.01)
*G11C 11/15*         (2006.01)
(Continued)

(52) U.S. Cl.
CPC ............ *G11C 11/15* (2013.01); *G11C 11/161* (2013.01); *H01L 27/1222* (2013.01); *H01L 43/02* (2013.01); *H01L 43/10* (2013.01)

(58) Field of Classification Search
CPC ... G11C 11/161; G11C 11/1675; G11C 11/15; G11C 11/1673; G11C 11/1659;
(Continued)

(56) References Cited

U.S. PATENT DOCUMENTS

2004/0179395 A1*   9/2004   Tsang ..................... G11C 11/15
                                                         365/171
2005/0195532 A1*   9/2005   Sugiyama ............. G11C 11/161
                                                         360/322
(Continued)

FOREIGN PATENT DOCUMENTS

JP              5985728 B1     9/2016
JP           2018-22796 A      2/2018
(Continued)

*Primary Examiner* — Michael T Tran
(74) *Attorney, Agent, or Firm* — Finnegan, Henderson, Farabow, Garrett & Dunner, L.L.P.

(57) ABSTRACT

According to one embodiment, a magnetic memory device includes a conductive member, a first magnetic layer, a first counter magnetic layer, and a first nonmagnetic layer. The conductive member includes a first portion, a second portion, and a third portion between the first portion and the second portion. The first counter magnetic layer is provided between the third portion and the first magnetic layer in a first direction crossing a second direction. The second direction is from the first portion toward the second portion. The first nonmagnetic layer is provided between the first magnetic layer and the first counter magnetic layer. The third portion includes a first position, and a second position between the first position and the first counter magnetic layer in the first direction. A second concentration of boron at the second position is lower than a first concentration of boron at the first position.

20 Claims, 8 Drawing Sheets

(51) Int. Cl.
  *H01L 27/12* (2006.01)
  *H01L 43/10* (2006.01)
  *H01L 43/02* (2006.01)

(58) Field of Classification Search
  CPC ....... G11C 11/18; H01L 27/222; H01L 43/10; H01L 43/02; H01L 43/08
  USPC .................................................. 365/171, 158
  See application file for complete search history.

(56) References Cited

U.S. PATENT DOCUMENTS

| | | | | |
|---|---|---|---|---|
| 2007/0177421 A1* | 8/2007 | Sugiyama | ............... | G11C 11/16 365/158 |
| 2008/0291585 A1* | 11/2008 | Yoshikawa | ............ | B82Y 25/00 360/324.11 |
| 2010/0080050 A1* | 4/2010 | Ozeki | ................ | G11C 11/5607 365/158 |
| 2010/0096716 A1* | 4/2010 | Ranjan | ................... | B82Y 10/00 257/421 |
| 2010/0244163 A1* | 9/2010 | Daibou | ................ | G11C 11/161 257/421 |
| 2011/0043950 A1* | 2/2011 | Carey | ................. | G01R 33/098 360/320 |
| 2012/0294077 A1* | 11/2012 | Liu | ....................... | G11C 11/161 365/171 |
| 2015/0076633 A1* | 3/2015 | Siddik | ................... | G11C 11/161 257/421 |
| 2015/0357015 A1* | 12/2015 | Kent | ....................... | G11C 11/16 365/158 |
| 2016/0043305 A1* | 2/2016 | Ochiai | ................... | H01L 43/10 257/421 |
| 2016/0260773 A1* | 9/2016 | Kitagawa | ................ | H01L 43/02 |
| 2017/0141158 A1 | 5/2017 | Daibou et al. | | |
| 2017/0263336 A1* | 9/2017 | Nakayama | ............. | G11C 29/44 |
| 2018/0040807 A1 | 2/2018 | Saito et al. | | |
| 2018/0040810 A1* | 2/2018 | Lee | ......................... | H01L 43/02 |
| 2018/0083186 A1* | 3/2018 | Sasaki | .................... | H01L 27/222 |
| 2018/0090671 A1 | 3/2018 | Kato et al. | | |
| 2018/0174634 A1 | 6/2018 | Kato et al. | | |
| 2018/0190899 A1* | 7/2018 | Kim | ........................ | H01L 43/08 |
| 2018/0268886 A1 | 9/2018 | Ishikawa et al. | | |
| 2018/0277745 A1* | 9/2018 | Oikawa | .................... | H01L 43/10 |
| 2018/0366639 A1 | 12/2018 | Kato et al. | | |
| 2019/0014425 A1* | 1/2019 | Liao | ........................ | H04R 9/06 |
| 2019/0051818 A1 | 2/2019 | Oikawa et al. | | |
| 2019/0080741 A1 | 3/2019 | Kato et al. | | |
| 2019/0081234 A1* | 3/2019 | Naik | ........................ | H01L 43/08 |
| 2019/0088860 A1 | 3/2019 | Saito et al. | | |
| 2019/0280188 A1* | 9/2019 | Brockman | .............. | H01L 43/12 |
| 2019/0392881 A1* | 12/2019 | Rakshit | .................. | G06N 3/063 |
| 2020/0313076 A1* | 10/2020 | Oguz | ................... | H01F 10/3272 |
| 2020/0402560 A1* | 12/2020 | Thirumala | ........... | G11C 11/1673 |
| 2020/0411094 A1* | 12/2020 | Jaiswal | ............... | G11C 14/0009 |

FOREIGN PATENT DOCUMENTS

| | | |
|---|---|---|
| JP | 6290487 B1 | 3/2018 |
| JP | 2018-56272 A | 4/2018 |
| JP | 2018-98432 A | 6/2018 |
| JP | 2019-4071 A | 1/2019 |
| JP | 2019-33185 A | 2/2019 |
| JP | 2019-54079 A | 4/2019 |
| JP | 2019-54154 A | 4/2019 |

\* cited by examiner

MAGNETIC MEMORY DEVICE

CROSS-REFERENCE TO RELATED APPLICATIONS

This application is based upon and claims the benefit of priority from Japanese Patent Application No. 2018-222137, filed on Nov. 28, 2018; the entire contents of which are incorporated herein by reference.

FIELD

Embodiments described herein relate generally to a magnetic memory device.

BACKGROUND

Stable operations of a magnetic memory device are desirable.

DETAILED DESCRIPTION

Figure 1:
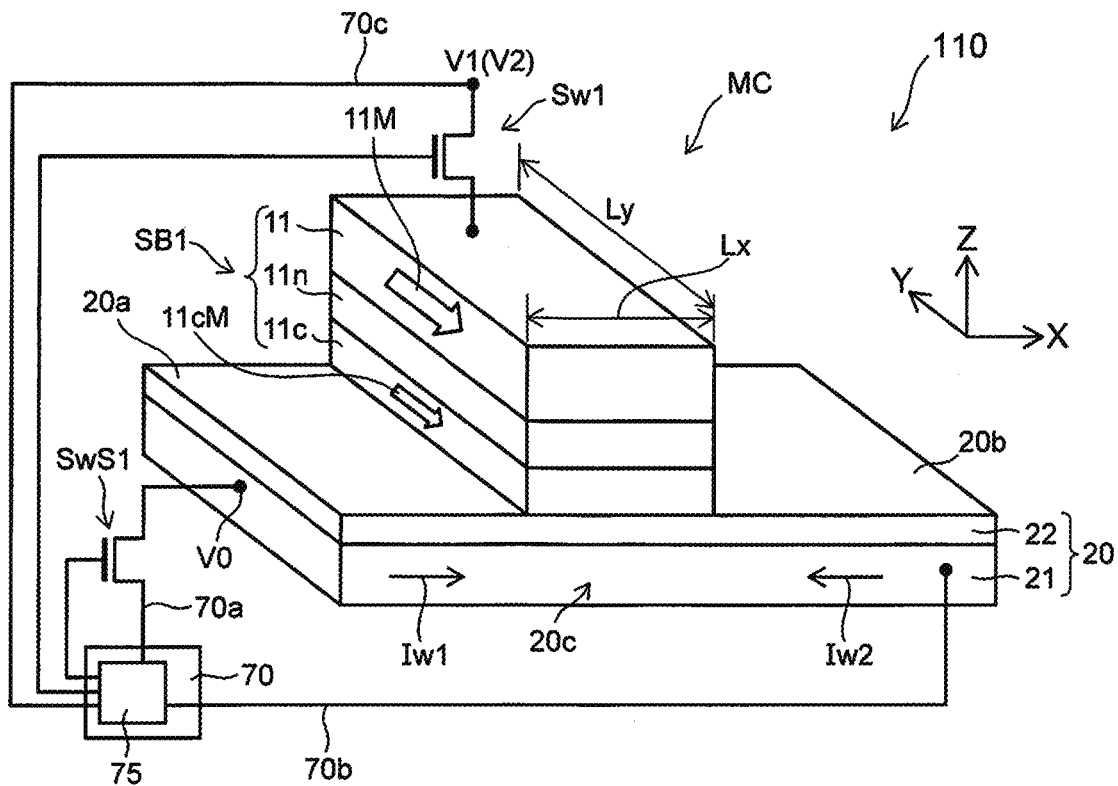
FIG. 1 is a schematic perspective view illustrating a magnetic memory device according to a first embodiment.

According to one embodiment, a magnetic memory device includes a conductive member, a first magnetic layer, a first counter magnetic layer, and a first nonmagnetic layer. The conductive member includes a first portion, a second portion, and a third portion between the first portion and the second portion. The first counter magnetic layer is provided between the third portion and the first magnetic layer in a first direction crossing a second direction. The second direction is from the first portion toward the second portion. The first nonmagnetic layer is provided between the first magnetic layer and the first counter magnetic layer. The third portion includes a first position, and a second position between the first position and the first counter magnetic layer in the first direction. A second concentration of boron at the second position is lower than a first concentration of boron at the first position.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic perspective view illustrating a magnetic memory device according to a first embodiment.

As shown in FIG. 1, the magnetic memory device 110 includes a conductive member 20, a first magnetic layer 11, a first counter magnetic layer 11c, and a first nonmagnetic layer 11n. The magnetic memory device 110 may further include a controller 70.

The conductive member 20 includes a first portion 20a, a second portion 20b, and a third portion 20c. The third portion 20c is provided between the first portion 20a and the second portion 20b.

The first counter magnetic layer 11c is provided between the third portion 20c and the first magnetic layer 11 in a first direction. The first direction crosses a second direction. The second direction is the direction from the first portion 20a toward the second portion 20b.

The first direction is taken as a Z-axis direction. One direction perpendicular to the Z-axis direction is taken as an X-axis direction. A direction perpendicular to the Z-axis direction and the X-axis direction is taken as a Y-axis direction. In the example, the second direction corresponds to the X-axis direction.

The first nonmagnetic layer 11n is provided between the first magnetic layer 11 and the first counter magnetic layer 11c in the first direction (the Z-axis direction). The first nonmagnetic layer 11n includes, for example, MgO, etc.

The first magnetic layer 11, the first counter magnetic layer 11c, and the first nonmagnetic layer 11n are included in a first stacked body SB1. The first stacked body SB1 is one magnetic element.

For example, the controller 70 is electrically connected to the first portion 20a and the second portion 20b. For example, the controller 70 includes a control circuit 75. For example, the control circuit 75 and the first portion 20a are electrically connected to each other by a first interconnect 70a. For example, the control circuit 75 and the second portion 20b are electrically connected to each other by a second interconnect 70b. For example, a switch SwS1 may be provided in a current path between the control circuit 75 and the conductive member 20. The switch SwS1 may be included in the controller 70.

For example, the controller performs a first operation and a second operation. In the first operation, the controller 70 supplies a first current Iw1 to the conductive member 20 from the first portion 20a toward the second portion 20b. In the second operation, the controller 70 supplies a second current Iw2 to the conductive member 20 from the second portion 20b toward the first portion 20a.

By such an operations, different electrical resistances are obtained in the first stacked body SB1. For example, the change of the electrical resistance corresponds to the change of the resistance between the first magnetic layer 11 and the first counter magnetic layer 11c. For example, the change of the electrical resistance may correspond to the change of the resistance between the first magnetic layer 11 and one of the first portion 20a or the second portion 20b. For example, the change of the electrical resistance may correspond to the electrical resistance between the first magnetic layer 11 and the conductive member 20.

For example, a first electrical resistance when the first current Iw1 flows is different from a second electrical resistance when the second current Iw2 flows.

In one example, the orientation of a magnetization 11cM of the first counter magnetic layer 11c changes more easily than the orientation of a magnetization 11M of the first magnetic layer 11. For example, the first counter magnetic layer 11c is a free magnetic layer; and the first magnetic layer 11 is a reference layer. For example, the magnetization 11cM of the first counter magnetic layer 11c is controlled to one orientation by the first current Iw1. For example, the magnetization 11cM of the first counter magnetic layer 11c is controlled to another orientation by the second current Iw2. Thus, the orientation of the magnetization 11cM is controlled to different multiple orientations. Multiple mutually-different electrical resistances are obtained thereby. The multiple electrical resistances correspond to multiple memory states stored in the magnetic memory device 110.

For example, the first stacked body SB1 may correspond to one memory cell MC.

For example, the control circuit 75 of the controller 70 may be electrically connected to the first magnetic layer 11. A switch Sw1 may be provided in a path (e.g., an interconnect 70c) between the control circuit 75 and the first magnetic layer 11. For example, the electrical resistance of the first stacked body SB1 may be detected by the controller 70. For example, the select or the unselect of the first stacked body SB1 may be controlled by the controller 70 controlling the potential of the first magnetic layer 11.

As shown in FIG. 1, the conductive member 20 may include multiple regions such as a first region 21, a second region 22, etc. The second region 22 is provided between the first region 21 and the first counter magnetic layer 11c in the Z-axis direction. For example, the second region 22 may physically contact the first counter magnetic layer 11c.

For example, the first region 21 includes a first metal. The first metal includes, for example, at least one selected from the group consisting of Hf, Ta, W, Re, Os, Ir, Pt, Au, Bi, Cu, Ag, and Pd. For example, the first region 21 applies a magnetic action to the first counter magnetic layer 11c. The magnetic action includes, for example, a spin Hall effect.

The second region 22 includes, for example, a second metal. The second metal includes, for example, at least one selected from the group consisting of Hf, Ta, W, Re, Os, Ir, Pt, Au, Bi, Cu, Ag, and Pd. For example, the second region 22 controls a characteristic (e.g., the crystallinity, etc.) of the first counter magnetic layer 11c. The second metal may be the same as the first metal. The second region 22 may apply a magnetic action to the first counter magnetic layer 11c.

Figure 2:
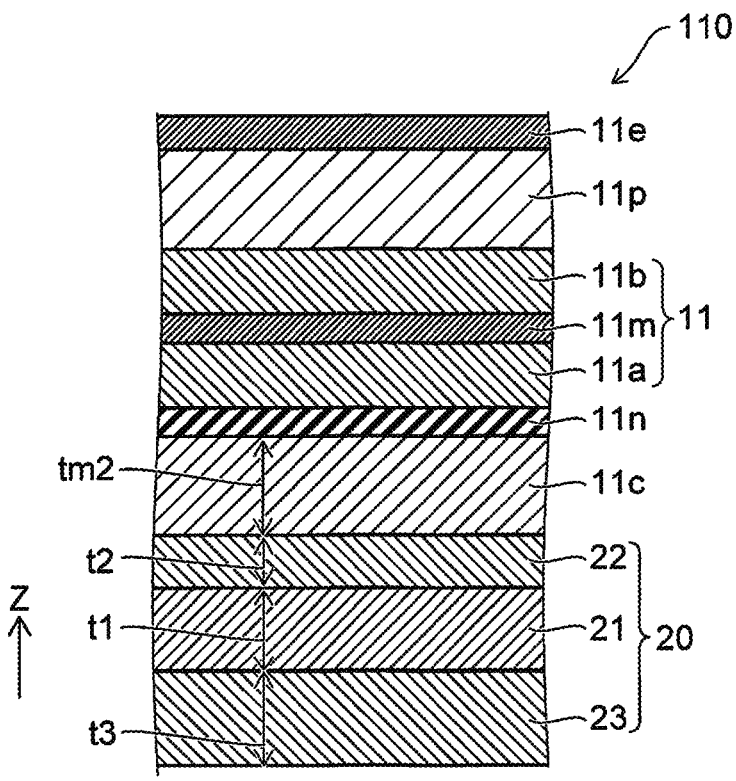
FIG. 2 is a schematic cross-sectional view illustrating the magnetic memory device according to the first embodiment.

FIG. 2 is a schematic cross-sectional view illustrating the magnetic memory device according to the first embodiment.

As shown in FIG. 2, the conductive member 20 may further include a third region 23 in addition to the first region 21 and the second region 22. The second region 22 is provided between the first counter magnetic layer 11c and the third region 23 in the Z-axis direction. The first region 21 is provided between the second region 22 and the third region 23 in the Z-axis direction.

The third region 23 includes, for example, a third metal. The third metal includes, for example, at least one selected from the group consisting of Hf, Ta, W, Re, Os, Ir, Pt, Au, Bi, Cu, Ag, and Pd. The third metal may be the same as the first metal and/or the second metal. For example, the electrical resistance of the conductive member 20 is reduced by the third region 23. For example, the flatness of the first region 21 is improved by the third region 23. For example, the flatness of the second region 22 is improved by the third region 23. For example, a stable conductive member 20 is obtained.

As shown in FIG. 2, the first magnetic layer 11 may include a first magnetic film 11a, a second magnetic film 11b, and an intermediate film 11m. The first magnetic film 11a is provided between the second magnetic film 11b and the first nonmagnetic layer 11n. The intermediate film 11m is provided between the first magnetic film 11a and the second magnetic film 11b. The intermediate film 11m includes, for example, at least one selected from the group consisting of Ru and Ir. For example, the first magnetic layer 11 may have an antiferromagnetically-coupled structure.

An electrode 11e and a magnetic portion 11p may be provided as shown in FIG. 2. The first magnetic layer 11 is provided between the electrode 11e and the first nonmagnetic layer 11n. The magnetic portion 11p is provided between the first magnetic layer 11 and the electrode 11e. The magnetic portion 11p includes, for example, at least one selected from the group consisting of IrMn and PtMn. For example, the magnetic portion 11p controls the magnetization 11M of the first magnetic layer 11.

A thickness tm2 of the first counter magnetic layer 11c is, for example, not less than 1 nm and not more than 10 nm. A thickness t1 of the first region 21 is, for example, not less than 1 nm and not more than 100 nm. A thickness t2 of the second region 22 is, for example, not less than 0.5 nm and not more than 3 nm. A thickness t3 of the third region 23 is, for example, not less than 0.5 nm and not more than 10 nm.

Figure 3:
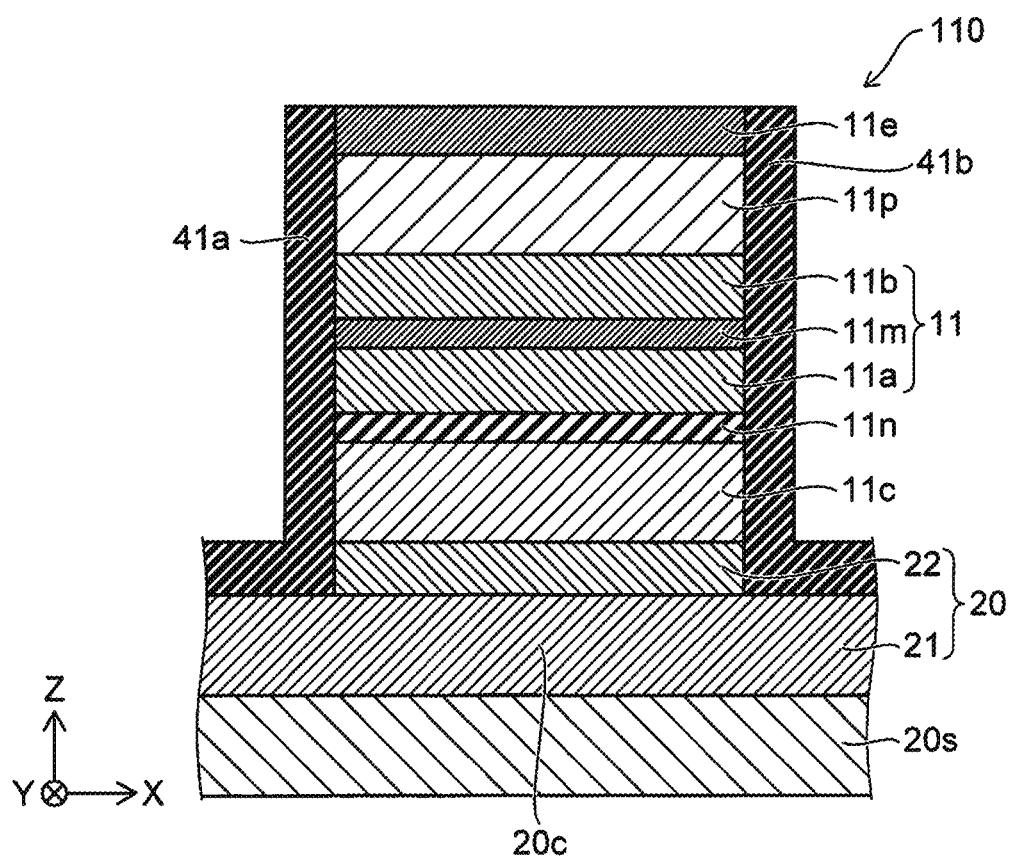
FIG. 3 is a schematic cross-sectional view illustrating the magnetic memory device according to the first embodiment.

FIG. 3 is a schematic cross-sectional view illustrating the magnetic memory device according to the first embodiment.

As shown in FIG. 3, the conductive member 20 may be provided at a base body 20s. For example, the first region 21 of the conductive member 20 may be provided on the base body 20s. The second region 22 may be provided on the first region 21. In the case where the third region 23 is provided (referring to FIG. 2), the third region 23 is provided between the base body 20s and the first region 21.

As shown in FIG. 3, the magnetic memory device 110 may further include a first compound region 41a. The first compound region 41a includes, for example, the second metal (e.g., the Hf, etc.) included in the second region 22 and at least one selected from the group consisting of oxygen and nitrogen. The first compound region 41a includes, for example, Hf and oxygen. The first compound region 41a includes a compound including the second metal and oxygen. The first compound region 41a may further include boron (B). The first compound region 41a may further include the first metal. The first compound region 41a may further include the first metal and boron (B).

The direction from the first nonmagnetic layer 11n toward the first compound region 41a is aligned with the second direction (e.g., the X-axis direction). In the example, the direction from the first counter magnetic layer 11c toward the first compound region 41a is aligned with the second direction (e.g., the X-axis direction). The direction from the first magnetic layer 11 toward the first compound region 41a is aligned with the second direction (e.g., the X-axis direction).

The magnetic memory device 110 may further include a second compound region 41b. The second compound region 41b includes the second metal and at least one selected from the group consisting of oxygen and nitrogen. The second compound region 41b includes, for example, Hf and oxygen. The second compound region 41b includes a compound including the second metal and oxygen. The second compound region 41b may further include the first metal. The second compound region 41b may further include the first metal and boron (B).

The first nonmagnetic layer 11n is provided between the first compound region 41a and the second compound region 41b in the second direction (e.g., the X-axis direction). The first counter magnetic layer 11c may be provided between the first compound region 41a and the second compound region 41b in the second direction (e.g., the X-axis direction). The first magnetic layer 11 may be provided between the first compound region 41a and the second compound region 41b in the second direction (e.g., the X-axis direction).

In the embodiment, the third region 23 of the conductive member 20 may be provided (referring to FIG. 2); and the first compound region 41a and the second compound region 41b also may be provided.

For example, the magnetic memory device 110 is formed as follows. For example, the conductive member 20 is provided on the base body 20s. A film that is used to form the first counter magnetic layer 11c, a film that is used to form the first nonmagnetic layer 11n, and a film that is used to form the first magnetic layer 11 are formed on the conductive member 20. Subsequently, these films are patterned. The first stacked body SB1 is obtained by the patterning.

The surface of the conductive member 20 is exposed by the patterning. At this time, there are cases where a portion of an element included in the second region 22 of the conductive member 20 adheres to the side surface of the first stacked body SB1. The adhered matter includes a compound of the second metal (e.g., Hf) included in the second region 22. The compound includes an oxide, a nitride, or an oxynitride. The compound includes the second metal. Such adhered matter corresponds to the first compound region 41a, the second compound region 41b, etc.

If the adhered matter is a stable insulator, the appropriate operations of the first stacked body SB1 are maintained. However, if the adhered matter has insufficient insulative properties, there are cases where the appropriate operations of the first stacked body SB1 are difficult to obtain. For example, the adhered matter causes an abnormal electrical resistance of the first stacked body SB1 (e.g., a short), etc. There are cases where the adhered matter affects the yield of the manufacturing processes.

The inventor of the application discovered that the material of the conductive member 20 affects abnormal electrical resistances in such a patterning process.

Examples of experiment results relating to the magnetic memory device will now be described.

In each of the samples described below, the conductive member 20, the first counter magnetic layer 11c, the first nonmagnetic layer 11n, and the first magnetic layer 11 are provided in this order on a substrate. The first nonmagnetic layer 11n is a MgO film (having a thickness of 1.6 nm). The first magnetic layer 11 includes the first magnetic film 11a, the intermediate film 11m, and the second magnetic film 11b. The first magnetic film 11a is a $Co_{40}Fe_{40}B_{20}$ film (having a thickness of 1.8 nm). The intermediate film 11m is a Ru film (having a thickness of 0.8 nm). The second magnetic film 11b is a $Co_{50}Fe_{50}$ film (having a thickness of 1.8 nm).

The configurations of the first counter magnetic layer 11c and the conductive member 20 for first to fourth samples will now be described.

In the first sample, the conductive member 20 includes the first region 21 and the second region 22. In the first sample, the film that is used to form the first counter magnetic layer 11c is a $Co_{40}Fe_{40}B_{20}$ film (having a thickness of 1.7 nm). The film that is used to form the second region 22 is a $Hf_{50}B_{50}$ film (having a thickness of 1 nm). The film that is used to form the first region 21 is a $Ta_{50}B_{50}$ film (having a thickness of 3 nm). Thus, the films that are used to form the first sample have a configuration of $Co_{40}Fe_{40}B_{20}/Hf_{50}B_{50}/Ta_{50}B_{50}$.

In the second to fourth samples, the conductive member 20 includes the first region 21, the second region 22, and the third region 23.

In the second sample, the film that is used to form the first counter magnetic layer 11c is a $Co_{40}Fe_{40}B_{20}$ film (having a thickness of 1.7 nm). The film that is used to form the second region 22 is a $Hf_{50}B_{50}$ film (having a thickness of 1 nm). The film that is used to form the first region 21 is a $Ta_{50}B_{50}$ film (having a thickness of 3 nm). The film that is used to form the third region 23 is a Ta film (having a thickness of 5 nm). Thus, the films that are used to form the second sample have a configuration of $Co_{40}Fe_{40}B_{20}/Hf_{50}B_{50}/Ta_{50}B_{50}/Ta$.

In the third sample, the conductive member 20 includes the first region 21 and the second region 22. The film that is used to form the first counter magnetic layer 11c is a $Co_{40}Fe_{40}B_{20}$ film (having a thickness of 1.5 nm). In the third sample, the film that is used to form the second region 22 is a $Ta_{50}B_{50}$ film (having a thickness of 3 nm). The film that is used to form the first region 21 is a Ta film (having a thickness of 1 nm). Thus, the films that are used to form the third sample have a configuration of $Co_{40}Fe_{40}B_{20}/Ta_{50}B_{50}/Ta$. In the third sample, the concentration of boron in the film used to form the second region 22 is higher than the concentration of boron in the film used to form the first region 21.

In the fourth sample, the film that is used to form the first counter magnetic layer 11c is a $Co_{40}Fe_{40}B_{20}$ film (having a thickness of 1.25 nm). In the fourth sample, the film that is used to form the conductive member 20 is a Ta film (having a thickness of 5 nm). Thus, the film that is used to form the fourth sample has a configuration of $Co_{40}Fe_{40}B_{20}/Ta$. The film that is used to form the conductive member 20 does not include B.

The various films recited above are formed by sputtering at room temperature (about 25° C.); and subsequently, heat treatment is performed. The conditions of the heat treatment are, for example, 1 hour at a temperature of 300° C. Subsequently, the first stacked body SB1 is obtained by patterning the stacked film including the films recited above by ion milling.

The reversal characteristic of the first counter magnetic layer 11c is evaluated for these samples.

Figure 4:
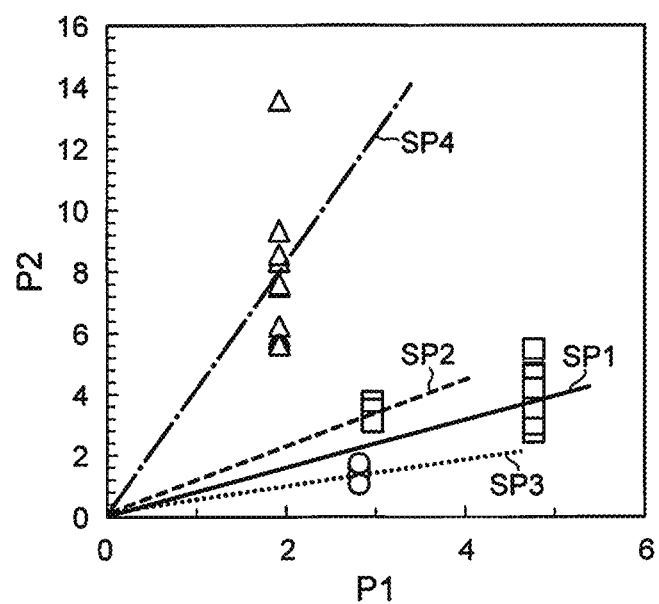
FIG. 4 is a graph illustrating a characteristic of the magnetic memory device.

FIG. 4 is a graph illustrating a characteristic of the magnetic memory device.

FIG. 4 illustrates the writing efficiency of the magnetic memory device. The horizontal axis of FIG. 4 is a first parameter P1 ($\times 10^{-4}$; arbitrary units). The first parameter P1 is ½ of the product of an effective perpendicular anisotropic magnetic field Hk_eff of the first counter magnetic layer 11c and the product (Mst) of the saturation magnetization and the thickness of the first counter magnetic layer 11c. The first parameter P1 corresponds to the magnetization reversal energy of the first counter magnetic layer 11c. The vertical axis of FIG. 4 is a second parameter P2 ($\times 10^{-6}$; arbitrary units) relating to the writing efficiency. The second parameter P2 is notated as "Isw/Δ." The second parameter P2 corresponds to a reversal current Isw for changing the orientation of the magnetization 11cM of the first counter magnetic layer 11c per unit retention energy Δ. In FIG. 4, the writing efficiency is high when the value of the second parameter P2 (the vertical axis) is small for the same value of the first parameter P1 (the horizontal axis). The relationships between the first parameter P1 and the second parameter P2 pass through the origin of the graph of FIG. 4. In FIG. 4, the writing efficiency is high when the slope of the second parameter P2 with respect to the first parameter P1 is low.

As shown in FIG. 4, the writing efficiency of the fourth sample SP4 is low. The second parameter P2 of the third sample SP3 is high. The second parameters P2 of the first sample SP1 and the second sample SP2 are between those of the third sample SP3 and the fourth sample SP4.

It can be seen from FIG. 4 that a high writing efficiency is obtained for the samples (the first to third samples SP1 to SP3) in which the conductive member 20 includes boron. For example, in the fourth sample SP4 in which the conductive member 20 does not include boron, it is considered that the boron moves from the first counter magnetic layer 11c toward the conductive member 20; and the concentration of boron in the first counter magnetic layer 11c becomes excessively low. If the concentration of boron in the first counter magnetic layer 11c becomes excessively low, the magnetization 11cM of the first counter magnetic layer 11c does not reverse easily. On the other hand, for example, compared to the case where boron is included in the conductive member 20, the spin Hall effect is small when boron is not included in the conductive member 20. When the spin Hall effect of the conductive member 20 is small, the current amount that is necessary for reversing the magnetization 11cM of the first counter magnetic layer 11c is large. It is considered that such factors cause the writing efficiency of the fourth sample SP4 to be low.

Conversely, the conductive member 20 includes boron in the first to third samples SP1 to SP3. Thereby, for example, the movement of boron from the first counter magnetic layer 11c toward the conductive member 20 is suppressed; and it is considered that a high concentration of boron is maintained in the first counter magnetic layer 11c thereby. It is considered that the ease of the reversal of the orientation of the magnetization 11cM of the first counter magnetic layer 11c is maintained thereby; and a high writing efficiency is obtained. For example, the spin Hall effect is large because the conductive member 20 includes boron. When the spin Hall effect of the conductive member 20 is large, the current amount that is necessary for reversing the magnetization 11cM of the first counter magnetic layer 11c is small. A high writing efficiency is obtained thereby.

In the third sample SP3, the concentration of boron in the film (the $Ta_{50}B_{50}$ film) used to form the second region 22 is higher than the concentration of boron in the film (the Ta film) used to form the first region 21. It is considered that a particularly high writing efficiency is obtained in such a third sample SP3.

Also, for these samples, multiple elements were made; and the electrical resistance between the first magnetic layer 11 and the conductive member 20 was evaluated. It was determined that a short had occurred when the measured electrical resistance was abnormal, that is, lower than a reference value. The occurrence rates of the abnormal electrical resistances of the multiple elements were determined.

Figure 5:
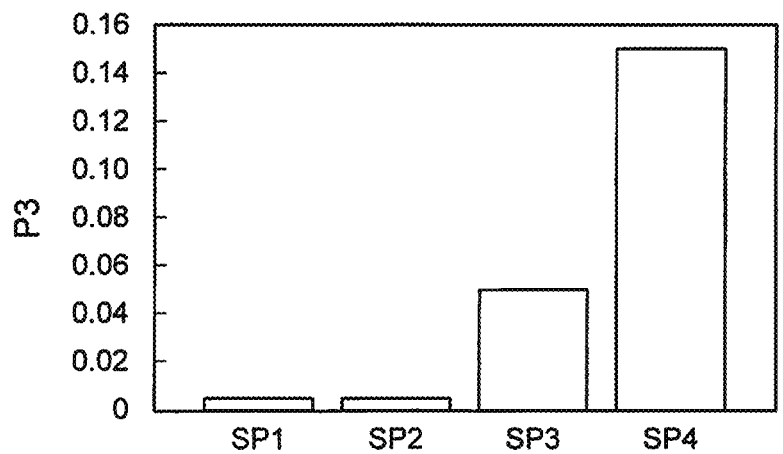
FIG. 5 is a graph illustrating the occurrence of the abnormal electrical resistance of the magnetic memory device.

FIG. 5 is a graph illustrating the occurrence of the abnormal electrical resistance of the magnetic memory device.

The vertical axis of FIG. 5 is an occurrence rate P3 of the abnormal electrical resistance of each sample.

As shown in FIG. 5, the occurrence rate P3 of the abnormal electrical resistance of the fourth sample SP4 is high. In the fourth sample SP4, the conductive member 20 is Ta. It is considered that the adhered matter on the side surface of the first stacked body SB1 includes tantalum and oxygen. It is considered that the cause of the high occurrence rate P3 of the abnormal electrical resistance in the fourth sample SP4 is perhaps because the adhered matter is unstable and has relatively low insulative properties.

As shown in FIG. 5, the occurrence rate P3 of the abnormal electrical resistance of the third sample SP3 is lower than the fourth sample SP4. In the third sample SP3, the second region 22 of the conductive member 20 includes Ta and boron. It is considered that the degree of the oxidization of the adhered matter on the side surface of the first stacked body SB1 is high because the second region 22 of the conductive member 20 includes boron. Therefore, it is considered that the insulative properties of the adhered matter are higher than the case (the fourth sample SP4) where boron is not included. It is considered that perhaps this causes the occurrence rate P3 of the abnormal electrical resistance to be lower for the third sample SP3 than for the fourth sample SP4.

As shown in FIG. 5, the occurrence rate P3 of the abnormal electrical resistance is extremely low for the first sample SP1 and the second sample SP2. In these samples, the second region 22 of the conductive member 20 includes Hf. It is considered that the adhered matter on the side surface of the first stacked body SB1 includes Hf and oxygen. It is considered that a compound including Hf and oxygen is generated stably in these samples. It is considered that the high insulative properties and the stability of the adhered matter including such a compound perhaps causes the extremely low occurrence rate P3 of the abnormal electrical resistance.

Examples of results of EELS (Electron Energy Loss Spectroscopy) analysis for the samples recited above will now be described. In the following graph, the horizontal axis is a position pZ in the depth direction (the Z-axis direction). The vertical axis of FIG. 6 is a detection intensity Int (arbitrary units).

Figure 6:
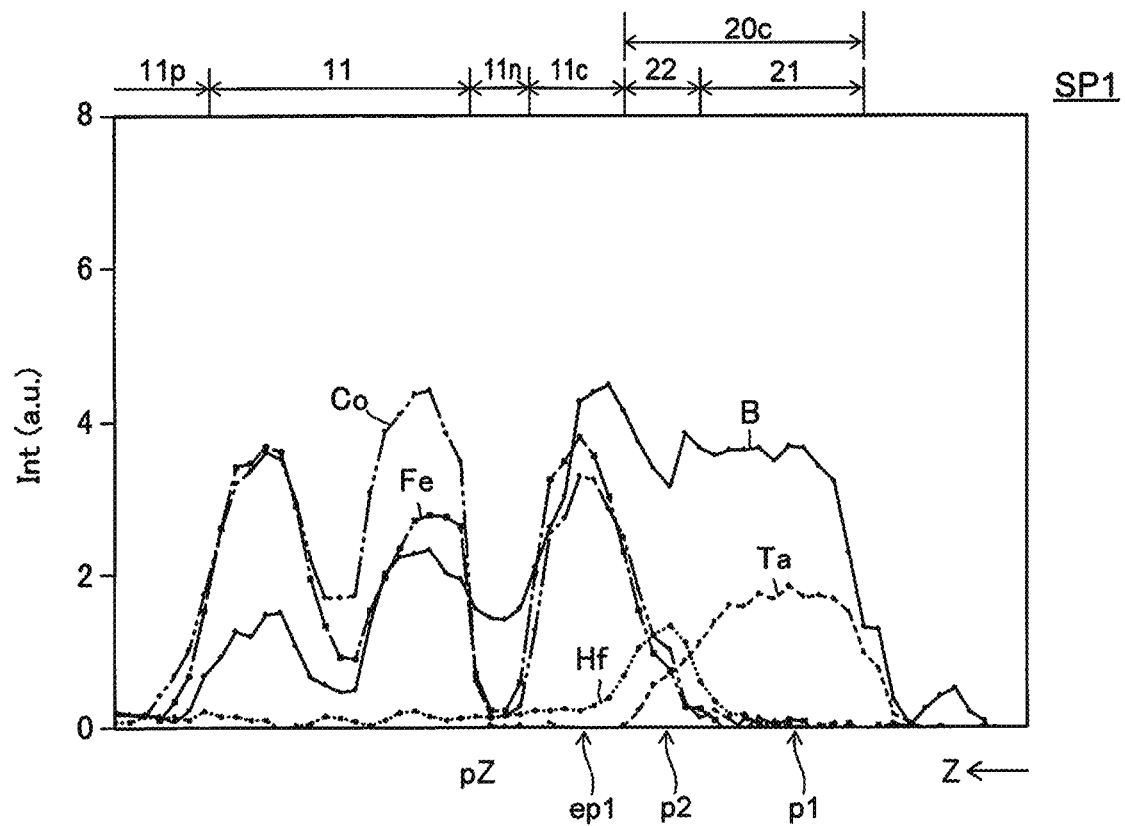
FIG. 6 is a graph illustrating analysis results.
Figure 7A:
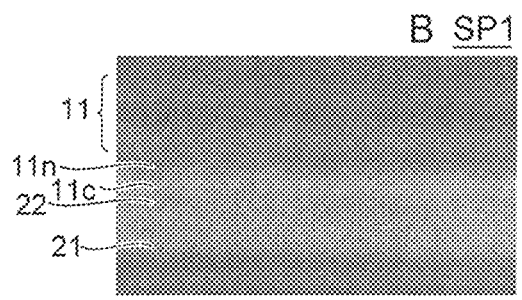
FIG. 7A to FIG. 7D are photographs illustrating experiment results.
Figure 7B:
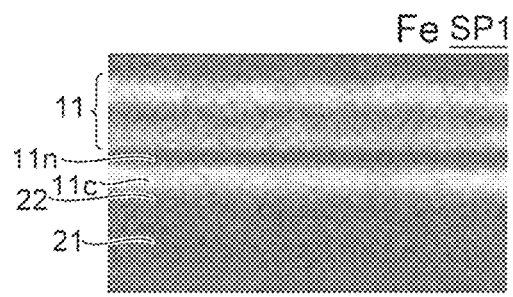
Figure 7C:
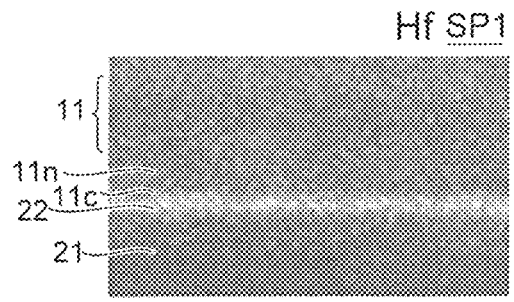
Figure 7D:
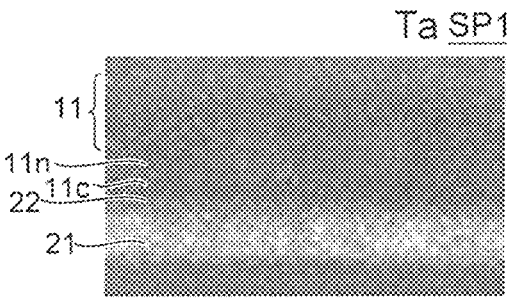

FIG. 6 is a graph illustrating analysis results.

FIG. 6 illustrates the results of EELS analysis of the first sample SP1 recited above. The detection intensities of B, Fe, Co, Hf, and Ta are shown in FIG. 6.

The detection intensity Int of Ta is high in a region at the right side of FIG. 6. This region corresponds to the first region 21. Left of the first region 21 is a region where the detection intensity Int of Hf is high. This region corresponds to the second region 22. Left of the second region 22 is a region where the intensities of Fe and Co are high. This region corresponds to the first counter magnetic layer 11c.

As shown in FIG. 6, it was found that the profile of the boron (B) concentration in the first sample SP1 has a special characteristic. Namely, when forming the films, the composition ratio of boron in the $Co_{40}Fe_{40}B_{20}$ film is relatively low, i.e., 20%; and the composition ratio of boron in the $Hf_{50}B_{50}$ film is relatively high, i.e., 50%. Also, the composition ratio of boron in the $Ta_{50}B_{50}$ film is relatively high, i.e., 50%.

Conversely, as shown in FIG. 6, the detection intensity Int of boron is low at the position corresponding to the second region 22 (the position corresponding to the $Hf_{50}B_{50}$ film).

For example, as shown in FIG. 6, the third portion 20c of the conductive member 20 includes a first position p1 and a second position p2. The second position p2 is between the first position p1 and the first counter magnetic layer 11c in the first direction (the Z-axis direction).

The second concentration of boron at the second position p2 is lower than the first concentration of boron at the first position p1.

The second position p2 includes the second metal. In the example, the second metal includes Hf. Along the direction passing through the first position p1 and the second position p2 (the analysis direction, i.e., the Z-axis direction), the concentration of the second metal (Hf) in the third portion 20c has a peak at the second position p2.

On the other hand, along the direction passing through the first position p1 and the second position p2 (the analysis direction, i.e., the Z-axis direction), the concentration of the first metal in the third portion 20c has a peak at the first position p1.

The first position p1 includes the first metal. In the example, the first metal includes Ta. The concentration (the first concentration) of boron at the first position p1 is higher than the second concentration.

Thus, for example, the concentration (the second concentration) of boron at the second position p2 where the second metal (e.g., Hf) has the peak is lower than the concentration (the first concentration) of boron at the first position p1 where the first metal (e.g., Ta) has the peak.

On the other hand, the first counter magnetic layer 11c includes boron and at least one first element selected from the group consisting of Fe and Co. In the example, the first element is Fe and Co.

As shown in FIG. 6, the first counter magnetic layer 11c includes a first element peak position ep1. The concentration of the first element (Fe and Co) in the first counter magnetic layer 11c has a peak at the first element peak position ep1. The concentration of boron at the first element peak position ep1 is higher than the second concentration at the second position p2.

In the profile of the concentration of boron in the first sample SP1, the concentration of boron at the first element peak position ep1 is higher than the second concentration at the second position p2. Therefore, it is considered that the boron that is included at the second position p2 (the second region 22) moves into the first counter magnetic layer 11c.

It is considered that the amorphousness of the first counter magnetic layer 11c increases due to the increase of the concentration of boron in the first counter magnetic layer 11c. It is considered that the magnetization 11cM of the first counter magnetic layer 11c changes easily thereby. The crystallinity of the first nonmagnetic layer 11n (e.g., the MgO film) on the first counter magnetic layer 11c improves when the amorphousness of the first counter magnetic layer 11c increases. As a result, for example, a stable magnetoresistance ratio is obtained. For example, it is considered that the crystallinity of the first magnetic layer 11 improves; and the magnetic characteristic of the first magnetic layer 11 improves.

It is considered that it is sufficient for the boron at the second position p2 (the second region 22) to have a composition ratio low enough to make the first counter magnetic layer 11c amorphous. Or, it is considered that it is sufficient for the boron at the second position p2 (the second region 22) to be a composition ratio low enough to make the second region 22 amorphous. Even if the composition ratio of boron in the film (in the example, the $Hf_{50}B_{50}$ film) for the second region 22 corresponding to the second position p2 is increased, the boron moves toward the first counter magnetic layer 11c due to the heat treatment; as a result, the concentration (the second concentration) of boron at the second position p2 easily decreases. For example, the second concentration has a local minimum value between the first counter magnetic layer 11c and the first region 21.

The boron at the second position p2 (the second region 22) may move further into the first position p1 (the first region 21). For example, the boron at the second position p2 (the second region 22) moves easily into the first position p1 (the first region 21) when the affinity between boron and the second metal (in the example, Hf) included at the second position p2 is lower than the affinity between boron and the first metal (in the example, Ta) included at the first position p1.

It is considered that the insulative properties of the adhered matter recited above easily become insufficient when the concentration of boron at the second position p2 (the second region 22) is excessively high. It is considered that stable insulative properties of the adhered matter are obtained by setting the concentration (the second concentration) of boron at the second position p2 (the second region 22) to be moderately low. In the first sample SP1 and the second sample SP2 illustrated in FIG. 5, the concentration (the second concentration) of boron at the second position p2 (the second region 22) is controlled to be moderately low. Stable operations are obtained easily even when the memory cell MC (the first stacked body SB1) is small.

On the other hand, if a film that does not include boron is formed as the second region 22, the concentration of boron in the first counter magnetic layer 11c becomes excessively low due to diffusion of the boron, etc. Therefore, the crystallinity of the first counter magnetic layer 11c increases; and it is difficult to obtain the desired characteristics (e.g., a high writing efficiency). Therefore, it is favorable for a film including boron to be used as the second region 22.

Also, it is favorable for the concentration (the first concentration) of boron at the first position p1 (the first region 21) to be higher than the concentration (the second concentration) of boron at the second position p2 (the second region 22). Thereby, the first region 21 is homogenized; and the flatness improves. Thereby, a high spin Hall effect is obtained; and the writing efficiency increases. The concentration (the first concentration) of boron at the first position p1 (the first region 21) may be not less than the concentration (the second concentration) of boron at the second position p2 (the second region 22).

Thus, in the embodiment, the second concentration of boron at the second position p2 is lower than the first concentration of boron at the first position p1. The occurrence rate P3 of the abnormal electrical resistance can be reduced thereby (referring to FIG. 5). The second concentration of boron at the second position p2 may be not more than the first concentration of boron at the first position p1.

FIG. 7A to FIG. 7D are photographs illustrating experiment results.

These figures are EELS images relating to the first sample SP1. FIG. 7A to FIG. 7D correspond respectively to boron (B), Fe, Hf, and Ta. In each of these figures, the light regions correspond to regions where the concentration is high for each of these elements. It can be seen from these figures that the concentration of boron is high in a portion of the region (the first counter magnetic layer 11c) including Fe. The concentration (the second concentration) of boron in the region (the second region 22) including Hf is lower than the concentration (the first concentration) of boron in the region (the first region 21) including Ta.

Figure 8:
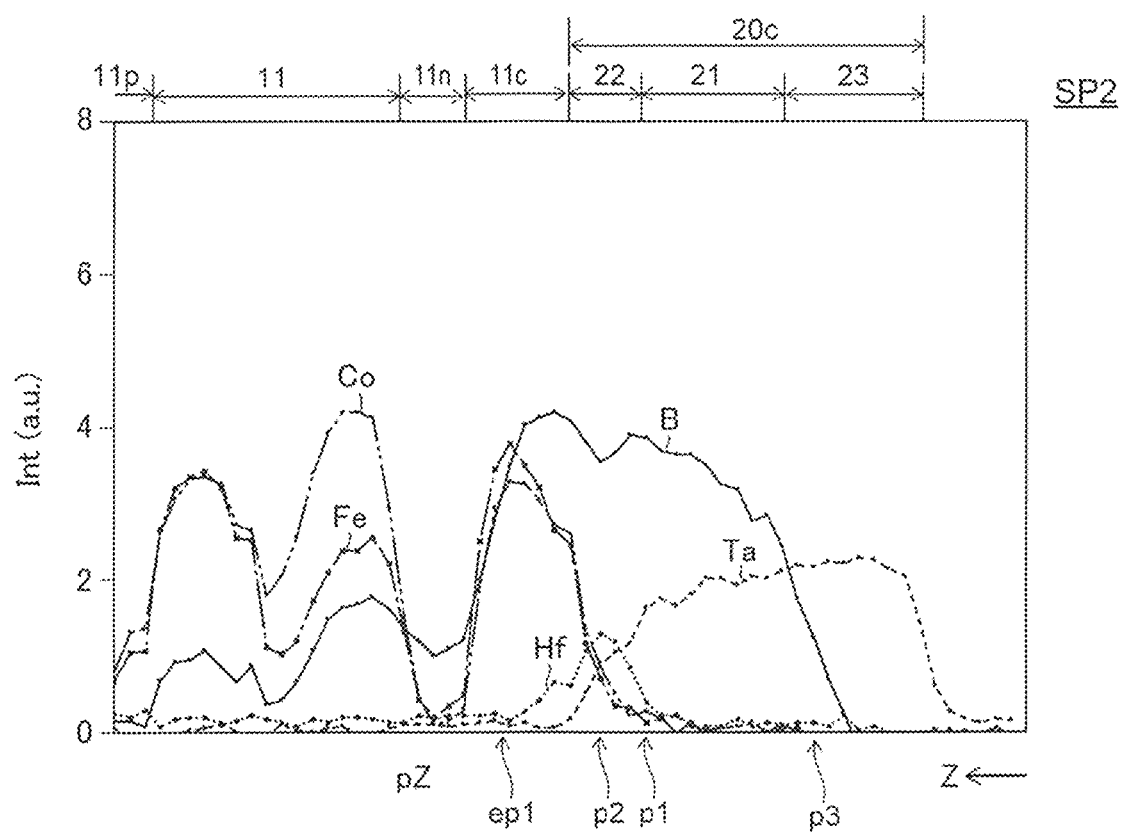
FIG. 8 is a graph illustrating analysis results.
Figure 9A:
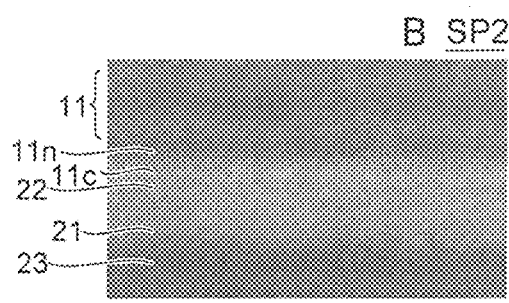
FIG. 9A to FIG. 9D are photographs illustrating experiment results.
Figure 9B:
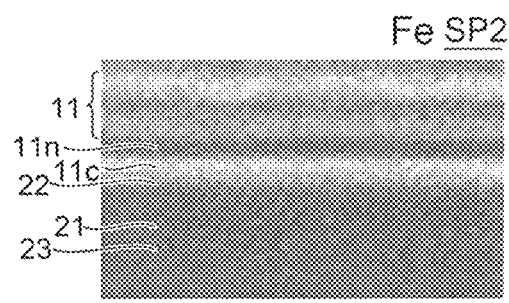
Figure 9C:
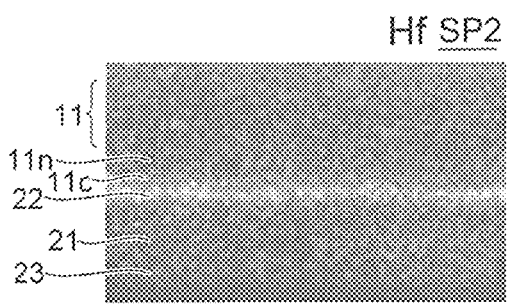
Figure 9D:
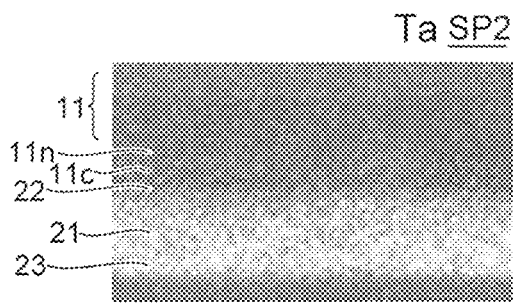

FIG. 8 is a graph illustrating analysis results.

FIG. 8 illustrates the results of EELS analysis of the second sample SP2. The detection intensities of B, Fe, Co, Hf, and Ta are shown in FIG. 8.

As shown in FIG. 8, the third portion 20c includes the first position p1 and the second position p2. The second position p2 is between the first position p1 and the first counter magnetic layer 11c in the first direction (the Z-axis direction). In the second sample SP2 as well, the second concentration of boron at the second position p2 is lower than the first concentration of boron at the first position p1.

Along the direction passing through the first position p1 and the second position p2 (the Z-axis direction), the concentration of the second metal (in the example, Hf) in the third portion 20c has a peak at the second position p2.

In such a case as well, the first counter magnetic layer 11c includes boron and the first element (at least one selected from the group consisting of Fe and Co). In the first counter magnetic layer 11c, the concentration of the first element has a peak at the first element peak position ep1. The concentration of boron at the first element peak position ep1 is higher than the concentration (the second concentration) of boron at the second position p2.

Thereby, for example, the amorphousness of the first counter magnetic layer 11c increases. For example, the insulative properties of the adhered matter generated in the patterning can be increased. For example, the uniformity of the first region 21 increases; and the flatness improves.

In addition to the first position p1 and the second position p2, the third portion 20c further includes a third position p3 including the third metal. The first position p1 is between the second position p2 and the third position p3 in the first direction (the Z-axis direction). As described above, the third metal includes at least one selected from the group consisting of Hf, Ta, W, Re, Os, Ir, Pt, Au, Bi, Cu, Ag, and Pd.

FIG. 9A to FIG. 9D are photographs illustrating experiment results.

These figures are EELS images relating to the second sample SP2. FIG. 9A to FIG. 9D correspond respectively to boron (B), Fe, Hf, and Ta. It can be seen from these figures that the concentration of boron is high in a portion of the region (the first counter magnetic layer 11c) including Fe. The concentration (the second concentration) of boron in the region (the second region 22) including Hf is lower than the concentration (the first concentration) of boron in the region (the first region 21) including Ta.

As described above, the film that is used to form the second sample SP2 has the configuration of $Co_{40}Fe_{40}B_{20}$/$Hf_{50}B_{50}$/$Ta_{50}B_{50}$/Ta. In such a case, the film that is used to form the second region 22 is a $Hf_{50}B_{50}$ film; the film that is used to form the first region 21 is a $Ta_{50}B_{50}$ film; and the film that is used to form the third region 23 is a Ta film. In the embodiment, in the case where three such films are provided, the concentration of B in the film used to form the first region 21 may be higher than the concentration of B in the film used to form the second region 22. For example, the second concentration of boron in the second region 22 may be not more than the first concentration of boron in the first region 21. For example, the concentration of boron in at least a portion of the first counter magnetic layer 11c may be higher than the second concentration (the concentration of boron in the second region 22).

For example, in the case where the second concentration of boron in the second region 22 is the same as the first concentration of boron in the first region 21, the second concentration of boron at the second position p2 may be lower than the first concentration of boron at the first position p1 due to the movement of the boron, etc.

In the embodiment, a length Ly in the Y-axis direction of the first magnetic layer 11 (referring to FIG. 1) may be longer than a length Lx in the X-axis direction of the first magnetic layer 11 (referring to FIG. 1). For example, the magnetization 11M of the first magnetic layer 11 easily is fixed to the desired orientation by the shape anisotropy.

In one example according to the embodiment, the second region 22 includes at least one selected from the group consisting of HfB, HfTaB, and HfWB. In one example according to the embodiment, the first region 21 includes at least one selected from the group consisting of HfB, TaB, WB, HfTaB, HfWB, and TaWB.

In the embodiment, the controller 70 may perform at least a first operation and a second operation recited below. As described above, the controller 70 is electrically connected to the first portion 20a and the second portion 20b (referring to FIG. 1). In the first operation, the controller 70 supplies the first current Iw1 to the conductive member 20 from the first portion 20a toward the second portion 20b. In the second operation, the controller 70 supplies the second current Iw2 to the conductive member 20 from the second portion 20b toward the first portion 20a.

As described above, the controller 70 may be electrically connected also to the first magnetic layer 11. The controller 70 may further perform a third operation and a fourth operation described below. In the first operation recited above, the controller 70 sets the potential difference between the first portion 20a and the first magnetic layer 11 to a first voltage V1 (referring to FIG. 1). In the second operation recited above, the controller 70 sets the potential difference between the first portion 20a and the first magnetic layer 11 to the first voltage V1. The voltage is, for example, a voltage referenced to a potential V0 of the first portion 20a.

In the third operation, the controller 70 sets the potential difference between the first portion 20a and the first magnetic layer 11 to a second voltage V2 (referring to FIG. 1) and supplies the first current Iw1 to the conductive member 20. In the fourth operation, the controller 70 sets the potential difference between the first portion 20a and the first magnetic layer 11 to the second voltage V2 and supplies the second current Iw2 to the conductive member 20.

The first voltage V1 is different from the second voltage V2. The first electrical resistance between the first magnetic layer 11 and the first portion 20a after the first operation is different from the second electrical resistance between the first magnetic layer 11 and the first portion 20a after the second operation. The first voltage V1 is, for example, a select potential.

For example, a third electrical resistance between the first magnetic layer 11 and the first portion 20a after the third operation is substantially the same as the electrical resistance before the third operation. For example, a fourth electrical resistance between the first magnetic layer 11 and the first portion 20a after the fourth operation is substantially the same as the electrical resistance before the fourth operation. The second voltage V2 is, for example, an unselect potential.

For example, the absolute value of the difference between the first electrical resistance and the second electrical resistance is greater than the absolute value of the difference between the third electrical resistance between the first magnetic layer 11 and the first portion 20a after the third operation and the fourth electrical resistance between the first magnetic layer 11 and the first portion 20a after the fourth operation.

The rewriting (e.g., the writing) of information is performed by the first operation and the second operation. The rewriting (e.g., the writing) of information is not performed by the third operation and the fourth operation.

Second Embodiment

Figure 10:
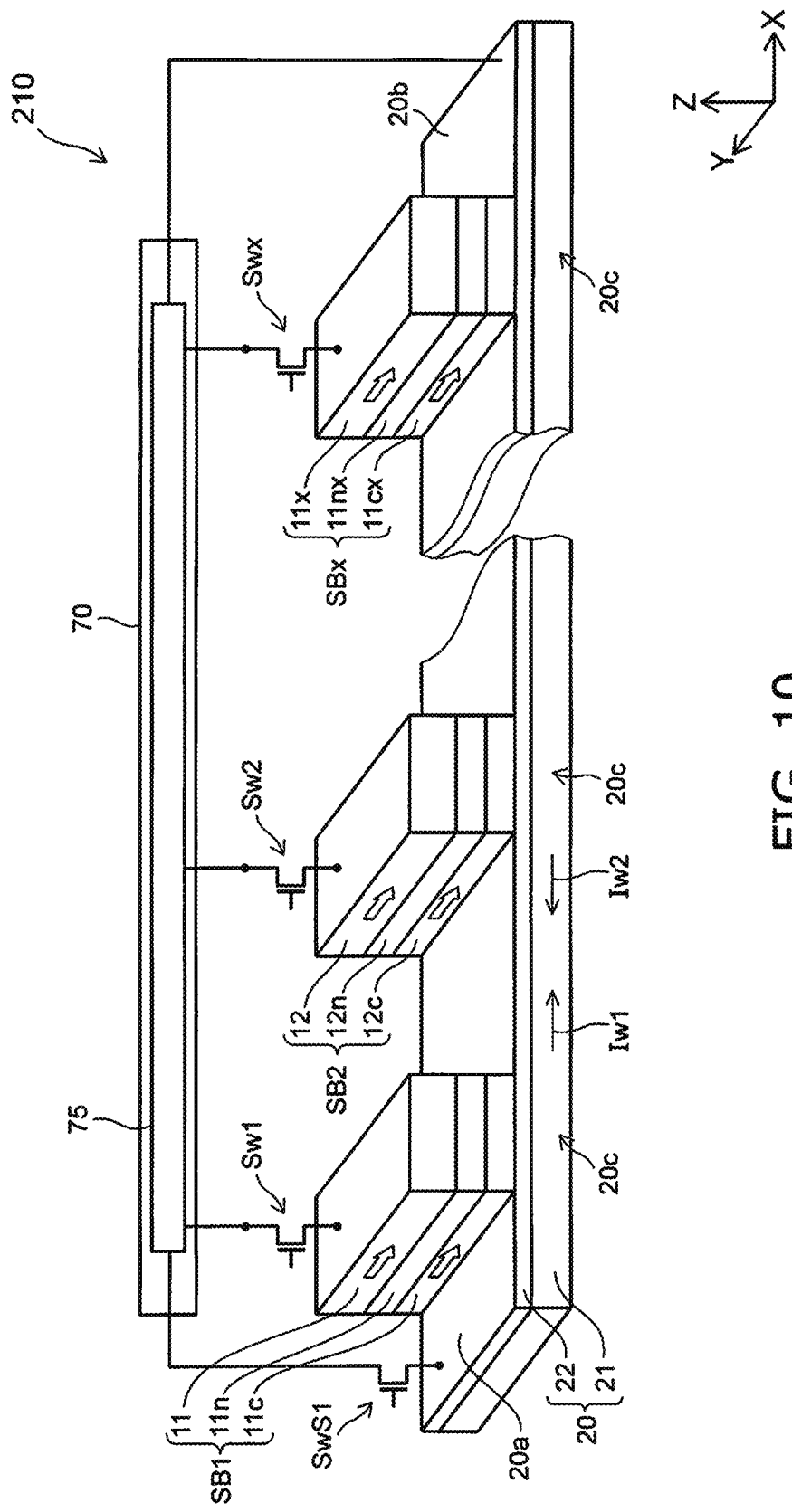
FIG. 10 is a schematic perspective view illustrating a magnetic memory device according to a second embodiment.

FIG. 10 is a schematic perspective view illustrating a magnetic memory device according to a second embodiment.

As shown in FIG. 10, multiple stacked bodies (the first stacked body SB1, a second stacked body SB2, a stacked body SBx, etc.) are provided in the magnetic memory device 210 according to the embodiment. Then, multiple switches (the switch Sw1, a switch Sw2, a switch Swx, etc.) are provided. Otherwise, the configuration of the magnetic memory device 210 is similar to that of the magnetic memory device 110.

The multiple stacked bodies are arranged along the conductive member 20. For example, the second stacked body SB2 includes a second magnetic layer 12, a second counter magnetic layer 12c, and a second nonmagnetic layer 12n. The second magnetic layer 12 is separated in the first direction (the Z-axis direction) from a portion of the conductive member 20. The second counter magnetic layer 12c is provided between the second magnetic layer 12 and the portion of the conductive member 20. The second nonmagnetic layer 12n is provided between the second magnetic layer 12 and the second counter magnetic layer 12c.

For example, the second magnetic layer 12 is separated from the first magnetic layer 11 in the second direction (e.g., the X-axis direction). The second counter magnetic layer 12c is separated from the first counter magnetic layer 11c in the second direction. The second nonmagnetic layer 12n is separated from the first nonmagnetic layer 11n in the second direction.

For example, the stacked body SBx includes a magnetic layer 11x, a counter magnetic layer 11cx, and a nonmagnetic layer 11nx. The magnetic layer 11x is separated in the first direction (the Z-axis direction) from another portion of the conductive member 20. The counter magnetic layer 11cx is provided between the magnetic layer 11x and the other portion of the conductive member 20. The nonmagnetic layer 11nx is provided between the magnetic layer 11x and the counter magnetic layer 11cx.

For example, the material and the configuration of the second magnetic layer 12 are the same as the material and the configuration of the first magnetic layer 11. For example, the material and the configuration of the second counter magnetic layer 12c are the same as the material and the configuration of the first counter magnetic layer 11c. For example, the material and the configuration of the second nonmagnetic layer 12n are the same as the material and the configuration of the first nonmagnetic layer 11n.

The multiple stacked bodies function as the multiple memory cells MC.

The switch Sw1 is electrically connected to the first magnetic layer 11. The switch Sw2 is electrically connected to the second magnetic layer 12. The switch Swx is electrically connected to the magnetic layer 11x. These switches are electrically connected to the control circuit 75 of the controller 70. Any of the multiple stacked bodies is selected by these switches.

In the example of the magnetic memory device 210, the second region 22 extends along the second direction (e.g., the X-axis direction). The second region 22 may not be provided in regions corresponding to the regions between the multiple stacked bodies.

Third Embodiment

Figure 11A:
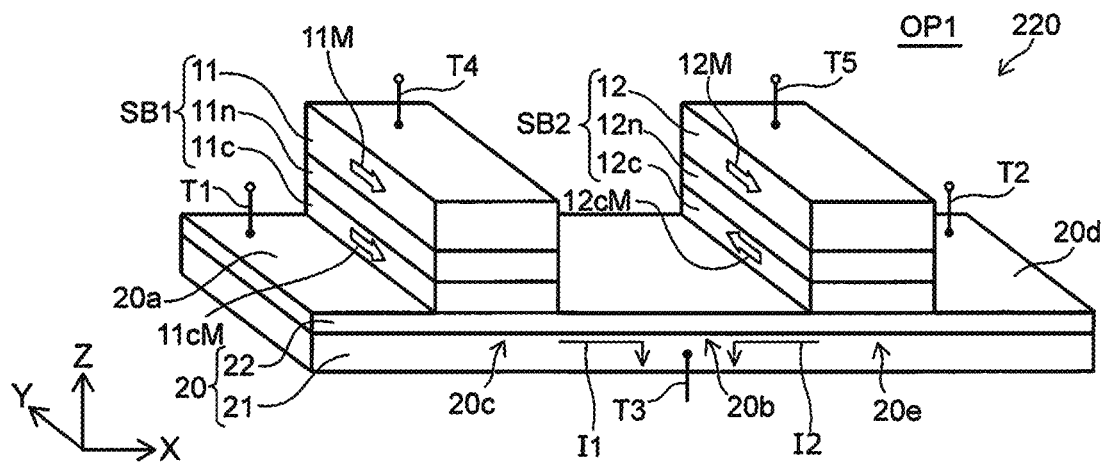
FIG. 11A to FIG. 11C are schematic perspective views illustrating a magnetic memory device according to a third embodiment.
Figure 11B:
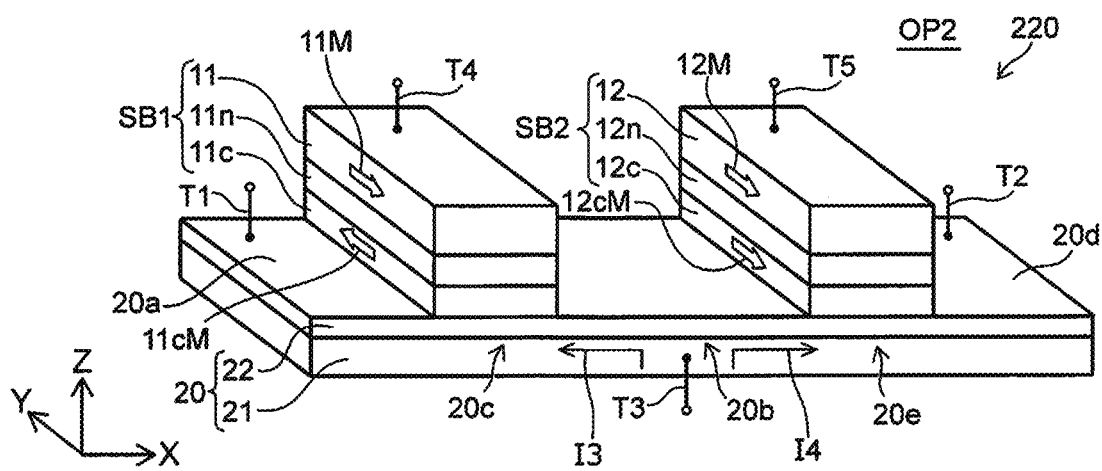
Figure 11C:
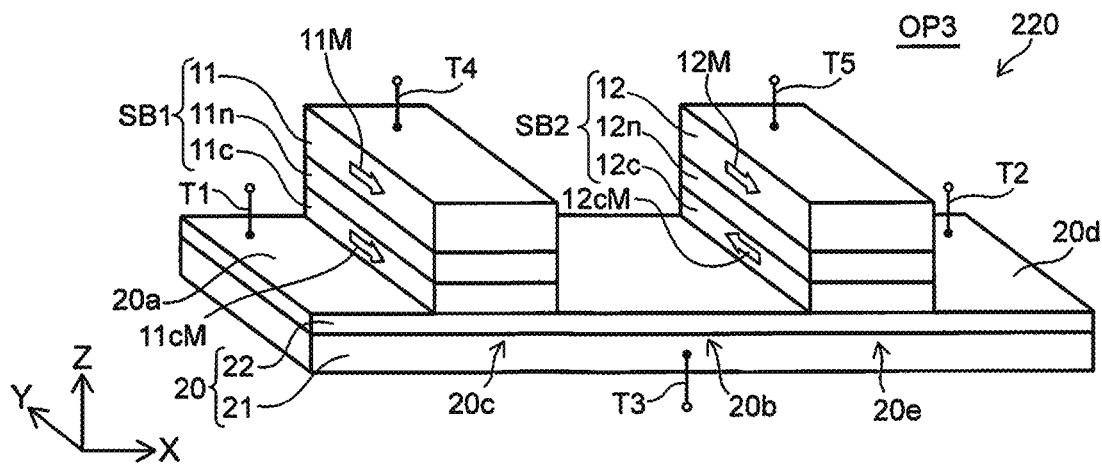

FIG. 11A to FIG. 11C are schematic perspective views illustrating a magnetic memory device according to a third embodiment.

As shown in FIG. 11A, the magnetic memory device 220 according to the embodiment includes the conductive member 20, the first stacked body SB1, and the second stacked body SB2. As described above, the first stacked body SB1 includes the first magnetic layer 11, the first counter magnetic layer 11c, and the first nonmagnetic layer 11n.

The second stacked body SB2 includes the second magnetic layer 12, the second counter magnetic layer 12c, and the second nonmagnetic layer 12n.

The conductive member 20 further includes a fourth portion 20d and a fifth portion 20e in addition to the first portion 20a, the second portion 20b, and the third portion 20c. The second portion 20b is between the third portion 20c and the fourth portion 20d in the second direction (e.g., the X-axis direction). The fifth portion 20e is between the second portion 20b and the fourth portion 20d in the second direction (e.g., the X-axis direction). The second counter magnetic layer 12c is provided between the fifth portion 20e and the second magnetic layer 12 in the first direction (the Z-axis direction).

In the second stacked body SB2 as well, the orientation of a magnetization 12cM of the second counter magnetic layer 12c is controlled by the current flowing through the conductive member 20. On the other hand, the orientation of a magnetization 12M of the second magnetic layer 12 is substantially fixed. The configuration of the second stacked body SB2 may be similar to the configuration of the first stacked body SB1.

In the example, a first terminal T1 is electrically connected to the first portion 20a. A third terminal T3 is electrically connected to the second portion 20b. A second terminal T2 is electrically connected to the fourth portion 20d. A fourth terminal T4 is electrically connected to the first magnetic layer 11. A fifth terminal T5 is electrically connected to the second magnetic layer 12.

The controller 70 (referring to FIG. 1) is electrically connected to the first to fifth terminals T1 to T5.

As shown in FIG. 11A and FIG. 11B, for example, the controller 70 performs a first operation OP1 and a second operation OP2.

In the first operation OP1 as shown in FIG. 11A, the controller 70 supplies a first current I1 from the first terminal T1 toward the third terminal T3 and supplies a second current I2 from the second terminal T2 toward the third terminal T3.

In the second operation OP2 as shown in FIG. 11B, the controller 70 supplies a third current I3 from the third terminal T3 toward the first terminal T1 and supplies a fourth current I4 toward the second terminal T2 from the third terminal T3.

One resistance state is obtained in the set of the two magnetic elements (the two stacked bodies) by the first operation OP1. Another one resistance state is obtained in the set of the two magnetic elements by the second operation OP2. For example, the first operation OP1 corresponds to a write operation of one of "1" or "0." For example, the second operation OP2 corresponds to the write operation of the other of "1" or "0."

In a third operation OP3 as shown in FIG. 11C, the controller 70 applies a voltage between the fourth terminal T4 and the fifth terminal T5 (between the first magnetic layer 11 and the second magnetic layer 12) and detects the potential of the third terminal T3 (the second portion 20b). The potential of the third terminal T3 (the second portion 20b) is different between the multiple resistance states. The multiple resistance states (the multiple memory states) can be detected by detecting the potential of the third terminal T3 (the second portion 20b).

For example, the energy consumed when reading in the third operation OP3 recited above can be lower than that of the case where a constant current is supplied to the stacked body (the magnetoresistive element) and the voltage (the potential difference) between the two magnetic layers of the magnetoresistive element is measured. In the third operation OP3 recited above, for example, high-speed reading can be performed.

Fourth Embodiment

Figure 12:
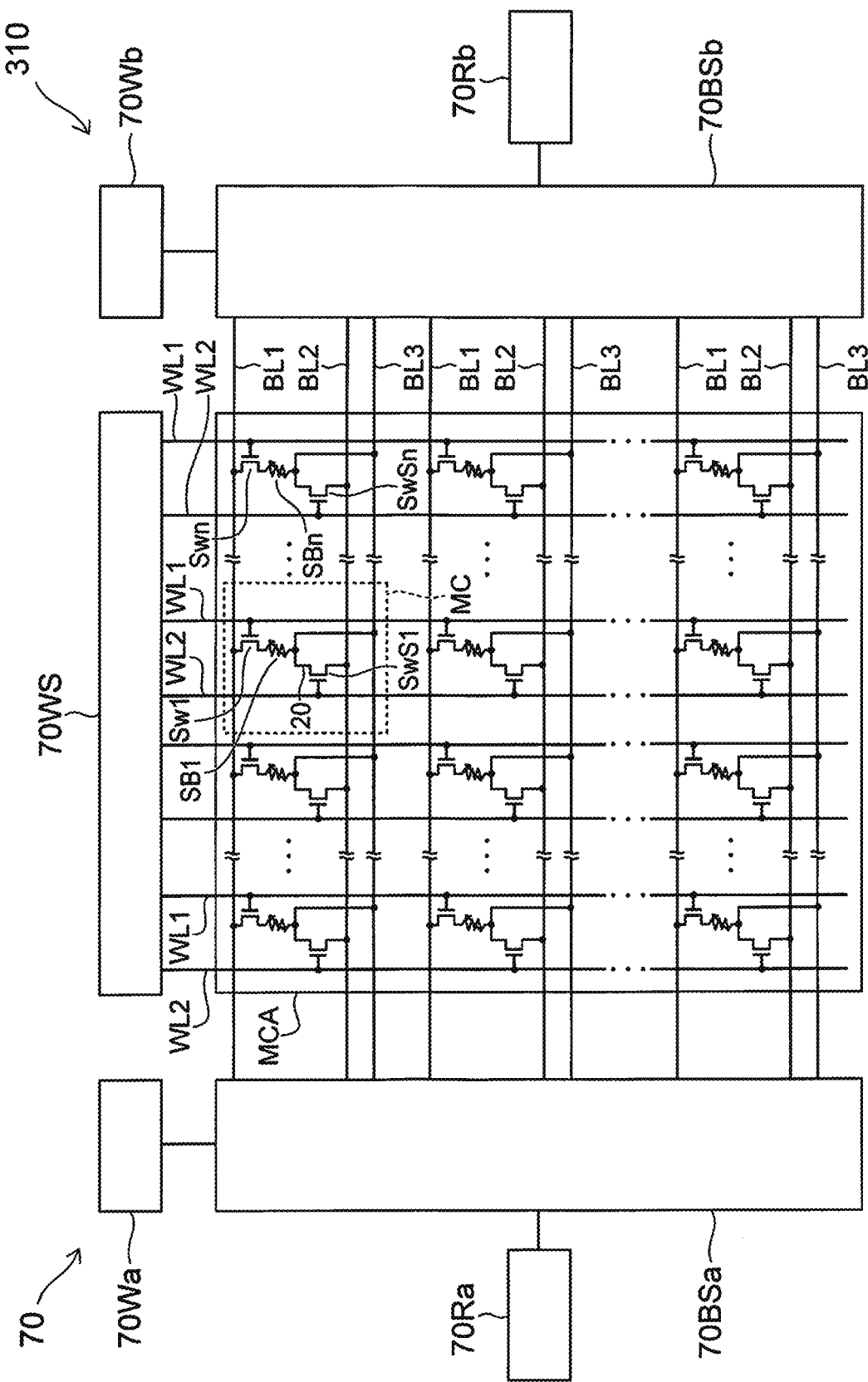
FIG. 12 is a schematic view showing a magnetic memory device according to a fourth embodiment.

FIG. 12 is a schematic view showing a magnetic memory device according to a fourth embodiment.

As shown in FIG. 12, a memory cell array MCA, multiple first interconnects (e.g., word lines WL1, WL2, etc.), multiple second interconnects (e.g., bit lines BL1, BL2, BL3, etc.), and the controller 70 are provided in the magnetic memory device 310 according to the embodiment. The multiple first interconnects extend in one direction. The multiple second interconnects extend in another one direction. The controller 70 includes a word line selection circuit 70WS, a first bit line selection circuit 70BSa, a second bit line selection circuit 70BSb, a first write circuit 70Wa, a second write circuit 70Wb, a first read circuit 70Ra, and a second read circuit 70Rb. Multiple memory cells MC are arranged in an array configuration in the memory cell array MCA.

For example, the switch Sw1 and the switch SwS1 are provided to correspond to one of the multiple memory cells MC. These switches may be considered to be included in one of the multiple memory cells MC. These switches may be considered to be included in the controller 70. These switches are, for example, transistors. The one of the multiple memory cells MC includes, for example, a stacked body (e.g., the first stacked body SB1).

As described in reference to FIG. 10, multiple stacked bodies (the first stacked body SB1, the second stacked body SB2, the stacked body SBx, etc.) may be provided in one conductive member 20. Multiple switches (the switch Sw1, the switch Sw2, the switch Swx, etc.) may be provided respectively for the multiple stacked bodies. In FIG. 12, one stacked body (the stacked body SB1 or the like) and one switch (the switch Sw1 or the like) are drawn to correspond to one conductive member 20 for easier viewing of the drawing.

As shown in FIG. 12, one end of the first stacked body SB1 is connected to the conductive member 20. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first portion 20a) of the conductive member 20 is connected to one of the source or the drain of the switch SwS1. The other end (e.g., the second portion 20b) of the conductive member 20 is connected to the bit line BL3. The other of the source or the drain of the switch SwS1 is connected to the bit line BL2. The gate of the switch SwS1 is connected to the word line WL2.

A stacked body SBn, a switch Swn, and a switch SwSn are provided for another one of the multiple memory cells MC.

An example of the write operation of the information to the memory cell MC will now be described.

The switch SwS1 of one memory cell MC (the selected memory cell) to which the writing is to be performed is set to the ON-state. For example, the ON-state is formed by setting, to a high-level potential, the word line WL2 connected to the gate of the one switch SwS1. The setting of the potential is performed by the word line selection circuit 70WS. The switch SwS1 of another memory cell MC (an unselected memory cell) of the column including the one memory cell MC (the selected memory cell) recited above also is set to the ON-state. The word line WL1 that is connected to the gate of the switch SwS1 inside the memory cell MC (the selected memory cell) and the word lines WL1 and WL2 that correspond to the other columns are set to a low-level potential.

The bit lines BL2 and BL3 that are connected to the memory cell MC (the selected cell) to which the writing is to be performed are selected. The selection is performed by the first bit line selection circuit 70BSa and the second bit line selection circuit 70BSb. The write current is supplied to the selected bit lines BL2 and BL3. The supply of the write current is performed by the first write circuit 70Wa and the second write circuit 70Wb. The write current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic layer 12 or the like) of the MTJ element (the first stacked body SB1 or the like) is changeable by the write current. The magnetization direction of the memory layer of the MTJ element is changeable to the reverse direction of that recited above when the write current flows toward one of the first bit line selection circuit 70BSa or the second bit line selection circuit 70BSb from the other of the first bit line selection circuit 70BSa or the second bit line selection circuit 70BSb. Thus, the writing is performed.

An example of the read operation of the information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON-state. At this time, the switches Sw1 of the other memory cells MC (the unselected cells) of the column including the memory cell MC (the selected cell) recited above also are set to the ON-state. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. The read current is supplied to the selected bit line BL1 and bit line BL3. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is detected by the first read circuit 70Ra and the second read circuit 70Rb. For example, the difference between the magnetization of the memory layer (the second magnetic layer 12) of the MTJ element and the magnetization of the reference layer (the first magnetic layer 11) of the MTJ element is detected. The difference includes the orientations of the magnetizations being in a mutually-parallel state (having the same orientation) or a mutually-antiparallel state (having the reverse orientation). Thus, the read operation is performed.

The embodiments may include, for example, the following configurations (e.g., technological proposals).

Configuration 1

A magnetic memory device, comprising:
a conductive member including a first portion, a second portion, and a third portion between the first portion and the second portion;
a first magnetic layer;
a first counter magnetic layer provided between the third portion and the first magnetic layer in a first direction crossing a second direction, the second direction being from the first-portion toward the second portion; and
a first nonmagnetic layer provided between the first magnetic layer and the first counter magnetic layer,
the third portion including a first position, and a second position between the first position and the first counter magnetic layer in the first direction,
a second concentration of boron at the second position being lower than a first concentration of boron at the first position.

Configuration 2

The magnetic memory device according to Configuration 1, wherein along a direction passing through the first position and the second position, a concentration of a second metal in the third portion has a peak at the second position.

Configuration 3

The magnetic memory device according to Configuration 2, wherein the second metal includes Hf.

Configuration 4

The magnetic memory device according to Configuration 2, wherein the second metal includes at least one selected from the group consisting of Hf, Ta, W, Re, Os, Ir, Pt, Au, Bi, Cu, Ag, and Pd.

Configuration 5

The magnetic memory device according to any one of Configurations 2 to 4, further comprising a first compound region including the second metal and at least one selected from the group consisting of oxygen and nitrogen,
a direction from the first nonmagnetic layer toward the first compound region being aligned with the second direction.

Configuration 6

The magnetic memory device according to Configuration 5, further comprising a second compound region including the second metal and at least one selected from the group consisting of oxygen and nitrogen,
the first nonmagnetic layer being provided between the first compound region and the second compound region in the second direction.

Configuration 7

The magnetic memory device according to Configuration 1, wherein along a direction passing through the first position and the second position, a concentration of a first metal in the third portion has a peak at the first position.

Configuration 8

The magnetic memory device according to Configuration 7, wherein the first metal includes at least one selected from the group consisting of Hf, Ta, W, Re, Os, Ir, Pt, Au, Bi, Cu, Ag, and Pd.

Configuration 9

The magnetic memory device according to any one of Configurations 1 to 8, wherein
the third portion further includes a third position including a third metal, and
the first position is between the second position and the third position in the first direction.

Configuration 10

The magnetic memory device according to Configuration 9, wherein the third metal includes at least one selected from the group consisting of Hf, Ta, W, Re, Os, Ir, Pt, Au, Bi, Cu, Ag, and Pd.

Configuration 11

The magnetic memory device according to any one of Configurations 1 to 10, wherein
the first counter magnetic layer includes boron and at least one first element selected from the group consisting of Fe and Co, and
in the first counter magnetic layer, a concentration of boron at a first element peak position is higher than the second concentration, the first element peak position being where a concentration of the first element has a peak.

Configuration 12

A magnetic memory device, comprising:
a conductive member including a first portion, a second portion, and a third portion between the first portion and the second portion;
a first magnetic layer;
a first counter magnetic layer provided between the third portion and the first magnetic layer in a first direction crossing a second direction, the second direction being from the first portion toward the second portion; and
a first nonmagnetic layer provided between the first magnetic layer and the first counter magnetic layer,
the third portion including a first region, and a second region between the first region and the first counter magnetic layer in the first direction,
a second concentration of boron in the second region being not more than a first concentration of boron in the first region.

Configuration 13

The magnetic memory device according to Configuration 12, wherein a concentration of boron in at least a portion of the first counter magnetic layer is higher than the second concentration.

Configuration 14

The magnetic memory device according to Configuration 12 or 13, further comprising a first compound region,
the second region including a second metal,
the first compound region including the second metal and at least one selected from the group consisting of oxygen and nitrogen,
a direction from the first nonmagnetic layer toward the first compound region being aligned with the second direction.

Configuration 15

The magnetic memory device according to Configuration 14, further comprising a second compound region including the second metal and at least one selected from the group consisting of oxygen and nitrogen,
the first nonmagnetic layer being provided between the first compound region and the second compound region in the second direction.

Configuration 16
The magnetic memory device according to Configuration 14 or 15, wherein the second metal includes Hf.
Configuration 17
The magnetic memory device according to Configuration 14 or 15, wherein the second metal includes at least one selected from the group consisting of Hf, Ta, W, Re, Os, Ir, Pt, Au, Bi, Cu, Ag, and Pd.
Configuration 18
The magnetic memory device according to any one of Configurations 1 to 17, further comprising a controller,
the controller being electrically connected to the first portion and the second portion,
the controller being configured to perform at least:
a first operation, of supplying a first current to the conductive member from the first portion toward the second portion; and
a second operation of supplying a second current to the conductive member from the second portion toward the first portion.
Configuration 19
The magnetic memory device according to Configuration 18, wherein
the controller is further electrically connected to the first magnetic layer,
the controller is configured to further perform at least a third operation and a fourth operation,
in the first operation, the controller is configured to set a potential difference between the first portion and the first magnetic layer to a first voltage,
in the second operation, the controller is configured to set the potential difference between the first portion and the first magnetic layer to the first voltage,
in the third operation, the controller is configured to set the potential difference between the first portion and the first magnetic layer to a second voltage and supplies the first current to the conductive member,
in the fourth operation, the controller is configured to set the potential difference between the first portion and the first magnetic layer to the second voltage and supplies the second current to the conductive member,
the first voltage is different from the second voltage,
a first electrical resistance between the first magnetic layer and the first portion after the first operation is different from a second electrical resistance between the first magnetic layer and the first portion after the second operation, and
an absolute value of a difference between the first electrical resistance and the second electrical resistance is greater than an absolute value of a difference between a third electrical resistance and a fourth electrical resistance, the third electrical resistance being between the first magnetic layer and the first portion after the third operation, the fourth electrical resistance being between the first magnetic layer and the first portion after the fourth operation.
Configuration 20
The magnetic memory device according to any one of Configurations 1 to 17, further comprising:
a second magnetic layer;
a second counter magnetic layer;
a second nonmagnetic layer; and
a controller,
the conductive member further including a fourth portion and a fifth portion,
the second portion being between the third portion and the fourth portion in the second direction,
the fifth portion being between the second portion and the fourth portion in the second direction,
the second counter magnetic layer being provided between the fifth portion and the second magnetic layer in the first direction,
the second nonmagnetic layer being provided between the second magnetic layer and the second counter magnetic layer,
the controller being electrically connected also to the first portion, the second portion, the fourth portion, the first magnetic layer, and the second magnetic layer,
in a first operation, the controller being configured to supply a first current from the first portion toward the second portion and supplying a second current from the fourth portion toward the second portion,
in a second operation, the controller being configured to supply a third current from the second portion toward the first portion and supplying a fourth current from the second portion toward the fourth portion.
Configuration 21
The magnetic memory device according to Configuration 20, wherein in a third operation, the controller is configured to apply a voltage between the first magnetic layer and the second magnetic layer and detects a potential of the second portion.

According to the embodiments, a magnetic memory device can be provided in which stable operations are possible.

In this specification, the notation of "first material/second material" means that the first material is positioned on the second material. For example, a layer of the first material is formed on a layer of the second material.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic layers, non-magnetic layers, conductive members, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a conductive member including a first portion, a second portion, and a third portion between the first portion and the second portion;
a first magnetic layer;
a first counter magnetic layer provided between the third portion and the first magnetic layer in a first direction crossing a second direction, the second direction being from the first portion toward the second portion; and
a first nonmagnetic layer provided between the first magnetic layer and the first counter magnetic layer,
the third portion including a first position, and a second position between the first position and the first counter magnetic layer in the first direction,
a second concentration of boron at the second position being lower than a first concentration of boron at the first position.

2. The device according to claim 1, wherein along a direction passing through the first position and the second position, a concentration of a second metal in the third portion has a peak at the second position.

3. The device according to claim 2, wherein the second metal includes Hf.

4. The device according to claim 2, wherein the second metal includes at least one selected from the group consisting of Hf, Ta, W, Re, Os, Ir, Pt, Au, Bi, Cu, Ag, and Pd.

5. The device according to claim 2, further comprising a first compound region including the second metal and at least one selected from the group consisting of oxygen and nitrogen,
a direction from the first nonmagnetic layer toward the first compound region being aligned with the second direction.

6. The device according to claim 5, further comprising a second compound region including the second metal and at least one selected from the group consisting of oxygen and nitrogen,
the first nonmagnetic layer being provided between the first compound region and the second compound region in the second direction.

7. The device according to claim 1, wherein along a direction passing through the first position and the second position, a concentration of a first metal in the third portion has a peak at the first position.

8. The device according to claim 7, wherein the first metal includes at least one selected from the group consisting of Hf, Ta, W, Re, Os, Ir, Pt, Au, Bi, Cu, Ag, and Pd.

9. The device according to claim 1, wherein
the third portion further includes a third position including a third metal, and
the first position is between the second position and the third position in the first direction.

10. The device according to claim 9, wherein the third metal includes at least one selected from the group consisting of Hf, Ta, W, Re, Os, Ir, Pt, Au, Bi, Cu, Ag, and Pd.

11. The device according to claim 1, wherein
the first counter magnetic layer includes boron and at least one first element selected from the group consisting of Fe and Co, and
in the first counter magnetic layer, a concentration of boron at a first element peak position is higher than the second concentration, the first element peak position being where a concentration of the first element has a peak.

12. A magnetic memory device, comprising:
a conductive member including a first portion, a second portion, and a third portion between the first portion and the second portion;
a first magnetic layer;
a first counter magnetic layer provided between the third portion and the first magnetic layer in a first direction crossing a second direction, the second direction being from the first portion toward the second portion; and
a first nonmagnetic layer provided between the first magnetic layer and the first counter magnetic layer,
the third portion including a first region, and a second region between the first region and the first counter magnetic layer in the first direction,
a second concentration of boron in the second region being not more than a first concentration of boron in the first region.

13. The device according to claim 12, wherein a concentration of boron in at least a portion of the first counter magnetic layer is higher than the second concentration.

14. The device according to claim 12, further comprising a first compound region,
the second region including a second metal,
the first compound region including the second metal and at least one selected from the group consisting of oxygen and nitrogen,
a direction from the first nonmagnetic layer toward the first compound region being aligned with the second direction.

15. The device according to claim 14, further comprising a second compound region including the second metal and at least one selected from the group consisting of oxygen and nitrogen,
the first nonmagnetic layer being provided between the first compound region and the second compound region in the second direction.

16. The device according to claim 14, wherein the second metal includes Hf.

17. The device according to claim 14, wherein the second metal includes at least one selected from the group consisting of Hf, Ta, W, Re, Os, Ir, Pt, Au, Bi, Cu, Ag, and Pd.

18. The device according to claim 1, further comprising a controller,
the controller being electrically connected to the first portion and the second portion,
the controller being configured to perform at least:
a first operation of supplying a first current to the conductive member from the first portion toward the second portion; and
a second operation of supplying a second current to the conductive member from the second portion toward the first portion.

19. The device according to claim 18, wherein
the controller is further electrically connected to the first magnetic layer,
the controller is configured to further perform at least a third operation and a fourth operation,
in the first operation, the controller is configured to set a potential difference between the first portion and the first magnetic layer to a first voltage,
in the second operation, the controller is configured to set the potential difference between the first portion and the first magnetic layer to the first voltage, in the third operation, the controller is configured to set the potential difference between the first portion and the first magnetic layer to a second voltage and supplies the first current to the conductive member, in the fourth operation, the controller is configured to set the potential difference between the first portion and the first magnetic layer to the second voltage and supplies the second current to the conductive member, the first voltage is different from the second voltage, a first electrical resistance between the first magnetic layer and the first portion after the first operation is different from a second electrical resistance between the first magnetic layer and the first portion after the second operation, and an absolute value of a difference between the first electrical resistance and the second electrical resistance is greater than an absolute value of a difference between a third electrical resistance and a fourth electrical resistance, the third electrical resistance being between the first magnetic layer and the first portion after the third operation, the fourth electrical resistance being between the first magnetic layer and the first portion after the fourth operation.

20. The device according to claim 1, further comprising:
a second magnetic layer;
a second counter magnetic layer;
a second nonmagnetic layer; and
a controller, the conductive member further including a fourth portion and a fifth portion, the second portion being between the third portion and the fourth portion in the second direction, the fifth portion being between the second portion and the fourth portion in the second direction, the second counter magnetic layer being provided between the fifth portion and the second magnetic layer in the first direction, the second nonmagnetic layer being provided between the second magnetic layer and the second counter magnetic layer, the controller being electrically connected also to the first portion, the second portion, the fourth portion, the first magnetic layer, and the second magnetic layer, in a first operation, the controller being configured to supply a first current from the first portion toward the second portion and supplying a second current from the fourth portion toward the second portion, in a second operation, the controller being configured to supply a third current from the second portion toward the first portion and supplying a fourth current from the second portion toward the fourth portion.

\* \* \* \* \*